United States Patent
Liu

(10) Patent No.: US 8,021,023 B2
(45) Date of Patent: Sep. 20, 2011

(54) LED ILLUMINATING DEVICE

(75) Inventor: Tay-Jian Liu, Taipei Hsien (TW)

(73) Assignee: Foxconn Technology Co., Ltd., Tu-Cheng, New Taipei (TW)

(*) Notice: Subject to any disclaimer, the term of this patent is extended or adjusted under 35 U.S.C. 154(b) by 360 days.

(21) Appl. No.: 12/482,403

(22) Filed: Jun. 10, 2009

(65) Prior Publication Data

US 2010/0265709 A1    Oct. 21, 2010

(30) Foreign Application Priority Data

Apr. 16, 2009 (CN) .......................... 2009 1 0301598

(51) Int. Cl.
*F21V 29/00* (2006.01)

(52) U.S. Cl. ............. 362/294; 165/104.26; 362/249.02; 362/580; 362/373; 362/547; 362/264; 362/218

(58) Field of Classification Search ................. 362/308, 362/294, 28, 555, 580, 559, 373, 345, 547, 362/264, 218; 165/104.26
See application file for complete search history.

(56) References Cited

U.S. PATENT DOCUMENTS

| | | | | |
|---|---|---|---|---|
| 4,322,737 A * | 3/1982 | Sliwa, Jr. | ...................... | 257/719 |
| 6,517,220 B2 * | 2/2003 | Wu | ............................... | 362/352 |
| 7,452,109 B2 * | 11/2008 | Noh et al. | ...................... | 362/294 |
| 2008/0175008 A1 * | 7/2008 | Hu et al. | ....................... | 362/373 |
| 2008/0266885 A1 * | 10/2008 | Sun et al. | ....................... | 362/373 |
| 2010/0078151 A1 * | 4/2010 | Koenigsberg et al. | ... | 165/104.26 |

* cited by examiner

*Primary Examiner* — Anabel Ton
*Assistant Examiner* — Danielle Allen
(74) *Attorney, Agent, or Firm* — Altis Law Group, Inc.

(57) ABSTRACT

An LED illuminating device includes an optical module and a heat dissipation device. The optical module includes a plurality of LEDs. The heat dissipation device includes a housing and a heat sink. The heat sink includes a base and a plurality of spaced fins formed on the base. The LEDs are thermally attached to a heat absorbing surface formed at a bottom of a bottom plate of the housing. The heat sink and the housing cooperatively define a hermetical chamber therebetween. A closed sidewall of the chamber is sandwiched between the base of the heat sink and the bottom plate of the housing. A wick structure is received in the chamber and attached to the heat dissipation device at a periphery of the chamber. A working fluid is filled in the chamber and saturated in the wick structure.

13 Claims, 8 Drawing Sheets

LED ILLUMINATING DEVICE

BACKGROUND

1. Technical Field

Embodiments of the present invention generally relates to light emitting diode (LED) illuminating devices, and particularly to an LED illuminating device with a high heat dissipating efficiency.

2. Description of Related Art

Presently, LEDs (light emitting diodes) are preferred for use in LED illuminating devices rather than CCFLs (cold cathode fluorescent lamps) due to a high brightness, a long lifespan, and a wide color range of the LED.

For an LED, eighty percents to ninety percents of the power consumed by the LED is converted into thermal energy, and only ten percents to twenty percents of the power consumed by the LED is converted into light. In addition, a plurality of LEDs are generally packaged in a single LED illuminating device in order to obtain a desirable illumination brightness. Therefore, heat dissipation of the LED illuminating device is a problem inhibiting the application of the LED illuminating device, which requires to be resolved.

For a high brightness LED illuminating device, a highly efficient heat dissipation device is necessary in order to timely and adequately remove the heat generated by the LED illuminating device. Otherwise, the brightness, lifespan, and reliability of the LED illuminating device will be seriously affected. Conventional heat dissipation devices, such as heat sinks, can no longer satisfy the heat dissipation requirement of the high brightness LED illuminating device.

Therefore, it is desirable to provide an LED illuminating device with a high heat dissipating efficiency.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
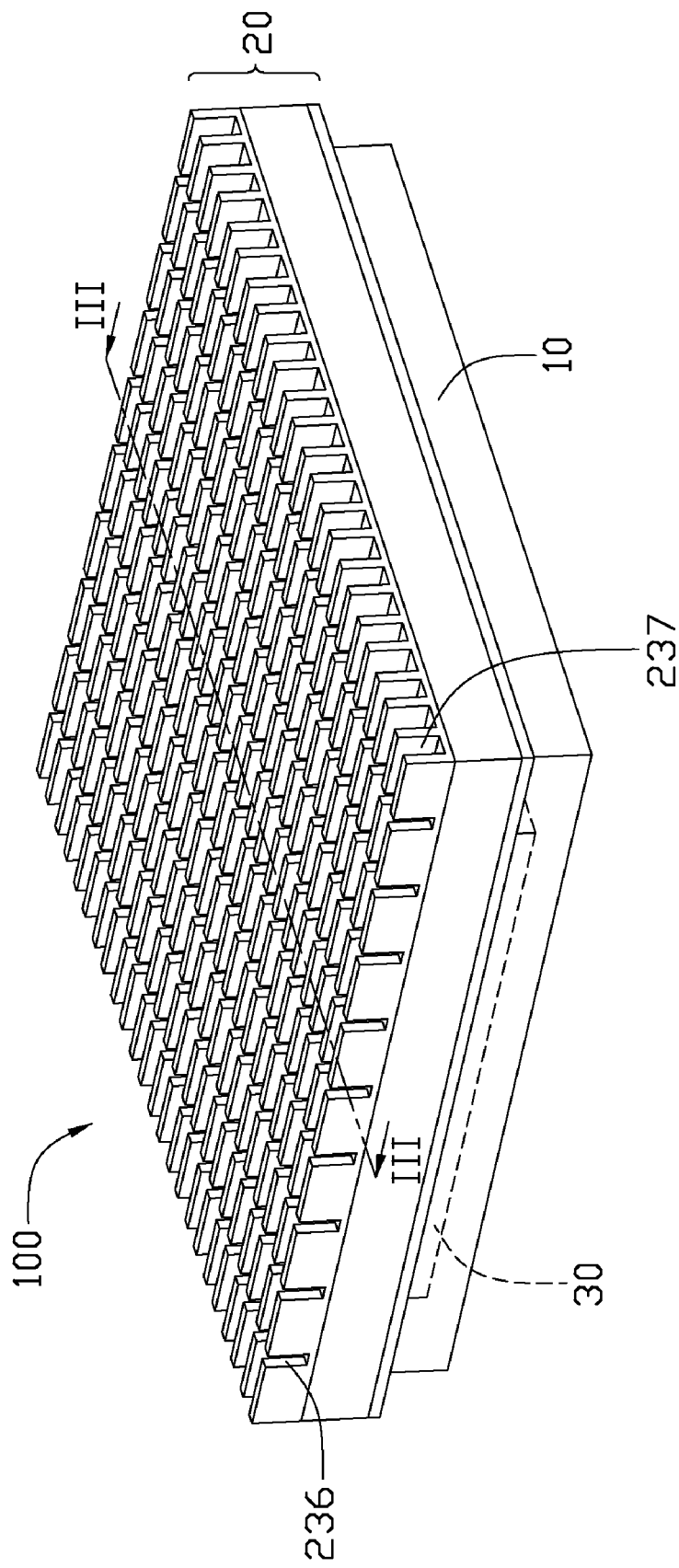
FIG. 1 is an assembled, isometric view of an LED illuminating device in accordance with a first embodiment.

Reference will now be made to the drawing figures to describe the various embodiments in detail.

Figure 2:
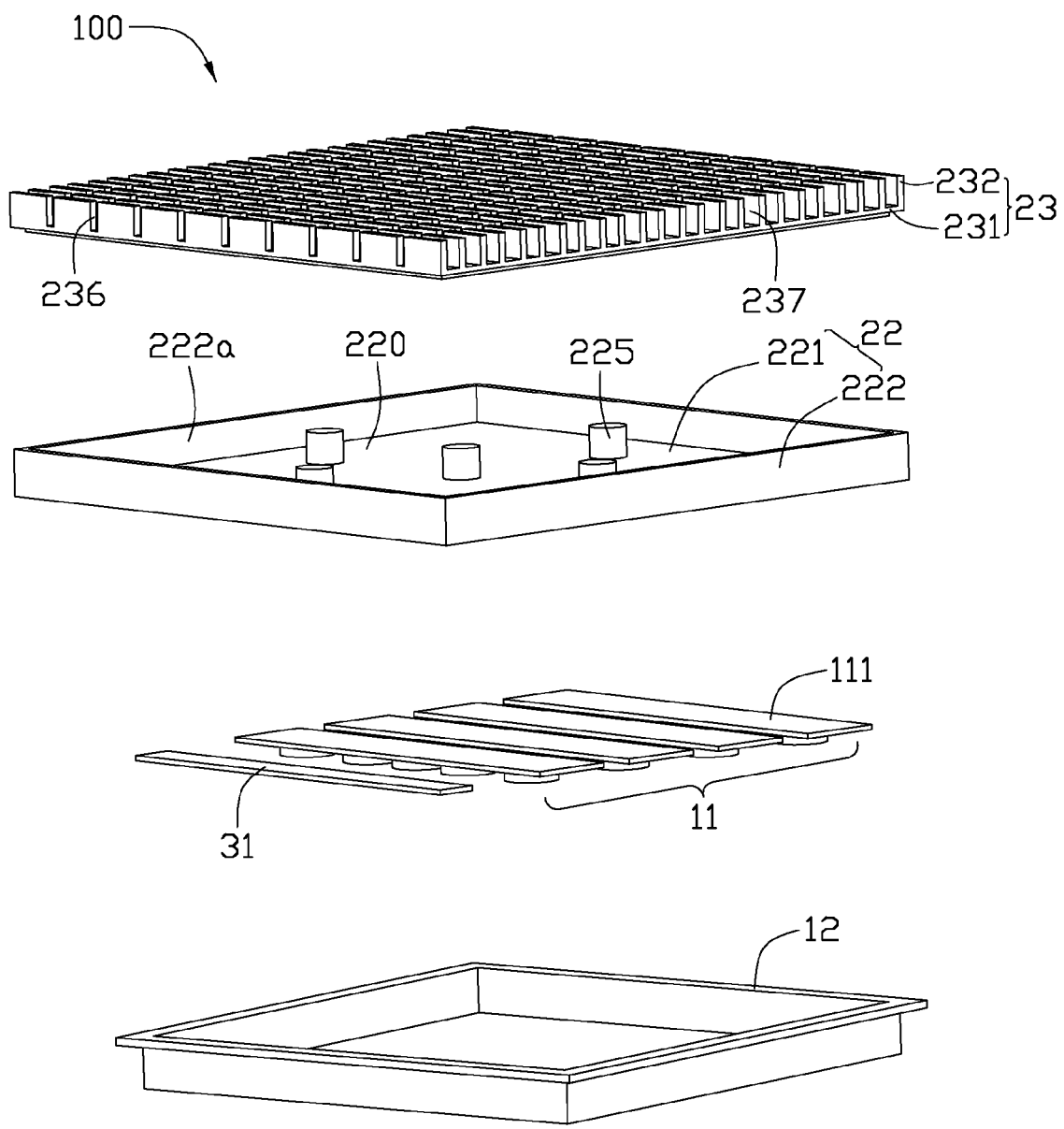
FIG. 2 is an exploded, isometric view of the LED illuminating device of FIG. 1, with a wick structure thereof removed.

Referring to FIGS. 1-2, an LED illuminating device 100 according to a first embodiment includes an optical module 10, a heat dissipation device 20 arranged above the optical module 10, and an electrical module 30 electrically connected with the optical module 10.

Figure 3:
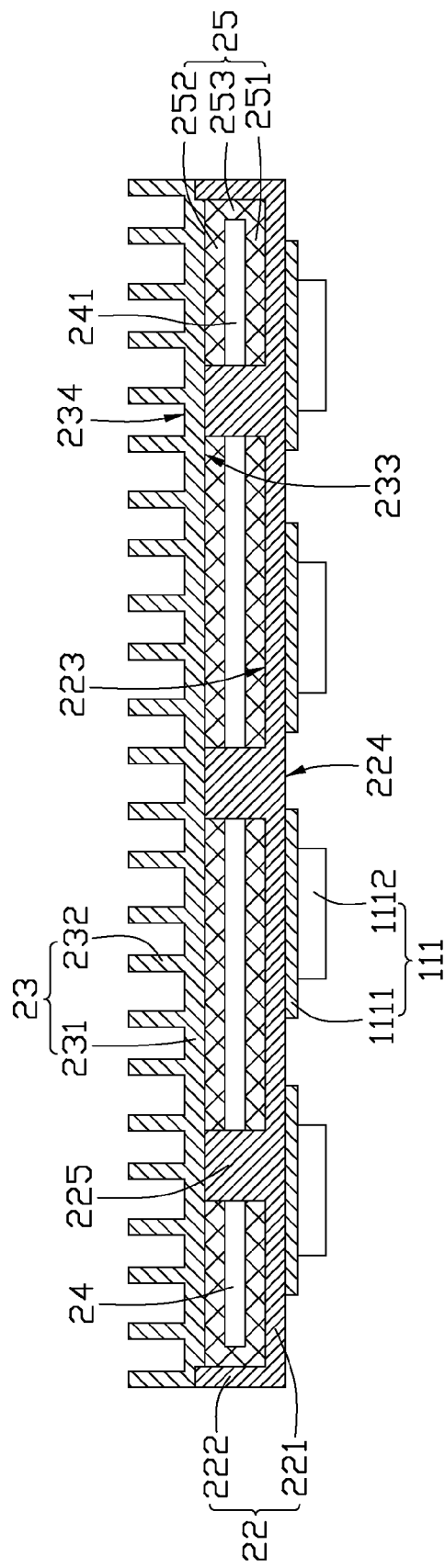
FIG. 3 is a cross-sectional view of a light engine of the LED illuminating device of FIG. 1, taken along line III-III thereof.

Referring also the FIG. 3, the heat dissipation device 20 includes a housing 22 and a heat sink 23 mounted on the housing 22. The housing 22 is made of a material with an excellent heat conductivity such as copper or aluminum. The housing 22 includes a bottom plate 221 and a closed sidewall 222 extending vertically and upwardly from an outer periphery of the bottom plate 221. The bottom plate 221 is substantially rectangular, and has an evaporating surface 223 at a top side thereof facing the heat sink 23 and an opposite heat absorbing surface 224 at a bottom side thereof. The housing 22 defines a recess 220 therein. The recess 220 is surrounded by the sidewall 222 and above the bottom plate 221. A plurality of supporting members are provided in the recess 220 and spaced from each other. In this embodiment, the supporting members are a plurality of supporting posts 225 extending upwardly from the evaporating surface 223 of the bottom plate 221.

The heat sink 23 includes a metal base 231 and a plurality of spaced metal fins 232 integrally extending from the base 231. The base 231 is substantially rectangular. The base 231 has an inner surface 233 at a bottom side thereof facing the housing 22, and an opposite outer surface 234 at a top side thereof. The fins 232 extend vertically and upwardly from the outer surface 234 of the base 231. An air passage 237 is defined between every two adjacent fins 232. A plurality of communicating grooves 236 are defined in each of the fins 232 to communicate with two adjacent air passages 237. The base 231 of the heat sink 23 is hermetically mounted to a top of the sidewall 222 of the housing 22. Thus, the heat sink 23 and the housing 22 cooperatively define a hermetical chamber 24 of the heat dissipation device 20 therebetween. Top ends of the supporting posts 225 in the hermetical chamber 24 contact with the inner surface 233 of the base 231 for supporting the heat sink 23. The hermetical chamber 24 has a substantially rectangular cross-section. In the hermetical chamber 24, a wick structure 25 is attached to an inner surface 222a of the sidewall 222, the evaporating surface 223 of the bottom plate 221 and the inner surface 233 of the base 231, which cooperatively define the hermetical chamber 24. In other words, the wick structure 25 is received in the hermetical chamber 24 and attached to the heat dissipation device 10 at a periphery of the hermetical chamber 24. The closed sidewall 222 forms a closed sidewall for the hermetical chamber 24. A working fluid, such as water, alcohol is filled in the hermetical chamber 24 and saturated in the wick structure 25. The hermetical chamber 24 is vacuumed to form a vacuum chamber thus making the working fluid be able to evaporate easily.

The wick structure 25 includes a first porous wick 251, a second porous wick 252 and a third porous wick 253. The first porous wick 251 is attached to the evaporating surface 223 of the bottom plate 221 of the housing 22. The second porous wick 252 is attached to the inner surface 233 of the base 231 of the heat sink 23 and spaced from the first porous wick 251. A vapor passage channel 241 is defined between the first porous wick 251 and the second porous wick 252. The third porous wick 253 is attached to the inner surface 222a of the sidewall 222 of the housing 22. Two ends of the third porous wick 253 connect with the first porous wick 251 and the second porous wick 252, respectively. Each of the first, the second and the third porous wicks 251, 252, 253 is selected from one of screen mesh, sintered powder, fiber, metal foam, and tiny grooves. The working fluid is saturated particularly in the first porous wick 251.

The optical module 10 includes an LED (light emitting diode) light source 11 and a light penetrable cover 12 in front of and below the LED light source 11. The LED light source 11 is thermally attached to the heat absorbing surface 224 of the bottom plate 221 of the housing 22 of the heat dissipating device 20. The heat dissipation device 20 and the LED light source 11 cooperatively form a light engine for the LED illuminating device 100.

The light source 11 includes a plurality of light bars 111. Each light bar 111 includes an elongated substrate 1111 and a plurality of LEDs 1112 arranged on the substrate 1111. The LEDs 1112 are evenly distributed along the substrate 1111, and are electrically connected to the substrate 1111. When the light bars 111 are mounted to the heat absorbing surface 224 of the bottom plate 221, a layer of thermal interface material (TIM) can be applied between the substrates 1111 of the light bars 111 and the heat absorbing surface 224 to eliminate an air interstice therebetween, to thereby enhance a heat conduction efficiency between the light bars 111 and the bottom plate 221 of the housing 22.

The light penetrable cover 12 is located in front of and below the light bars 111 and mounted on the housing 22 of the heat dissipation device 20. Light emitted by the LEDs 1112 of the light bars 111 is guided to an outer environment by the light penetrable cover 12. The light penetrable cover 12 provides protection to the LED light source 11.

The electrical module 30, which provides drive power, control circuit and power management for the LED light source 11, includes a circuit board 31 electrically connected with the LED light source 11. The circuit board 31 is mounted on the heat absorbing surface 224 of the bottom plate 221 of the housing 22 and beside the light source 11. The light penetrable cover 12 is mounted on the housing 22 and receives the LED light source 11 and the circuit board 31 mounted on the heat absorbing surface 224 of the bottom plate 221 of the housing 22 therein.

In operation, heat generated by the LEDs 1112 is absorbed by the bottom plate 221 of the housing 22. The heat of the LEDs 1112 is rapidly transferred from the bottom plate 221 to the working fluid in the hermetical chamber 24. The working fluid saturated in the first porous wick 251 is heated and then vaporizes into vapor. The vapor flows upwardly and laterally along the vapor passage channel 241 of the hermetical chamber 24. As the vapor goes up along vapor passage channel 241 to contact with the inner surface 233 of the base 231 of the heat sink 23, the heat carried by the vapor is released to the base 231, and dissipated to ambient atmosphere particularly by the fins 232 of the heat sink 23. After the vapor releases the heat, the vapor is condensed into liquid. The liquid is absorbed by the second porous wick 252, and then drawn back to the first porous wick 251 via capillary forces provided by the third porous wick 253. The liquid returned back to the first porous wick 251 is available for a next phase change cycle, whereby the heat of the LEDs 1112 is continuously and effectively removed by heat dissipation device 20. Further, the supporting posts 225 arranged in the hermetical chamber 24 are capable of transferring heat from the bottom plate 221 of the housing 22 to the base 231 of the heat sink 23 directly, which increases the heat conduction efficiency of the heat dissipation device 20.

Heat transferred to the heat sink 23 is dissipated to the ambient atmosphere by natural air convection. Air in the air passages 237 of the heat sink 23 is heated by the heat transferred to the fins 232 and the base 231 of the heat sink 23, and then flows upwardly. The heated, upwardly flowing air escapes to the ambient atmosphere at a top side of the heat sink 23. Cooling air in the ambient atmosphere enters into the air passages 237 via two opposite ends of the air passages 237 and via the communicating grooves 236 of the fins 232, whereby a natural air convection is circulated through the heat sink 23.

Figure 4:
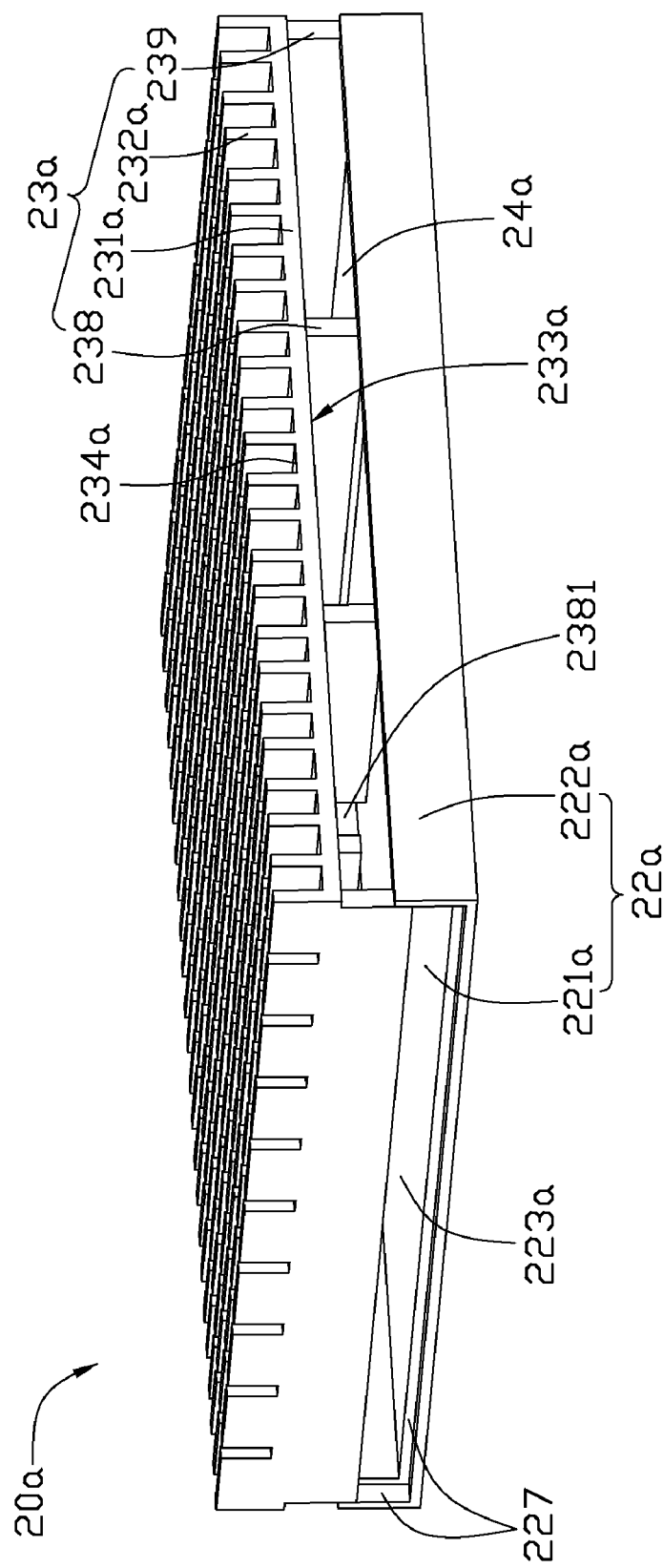
FIG. 4 is an exploded, isometric view of a heat dissipating device of an LED illuminating device according to a second embodiment, with a wick structure thereof removed.

Referring to FIG. 4, a heat dissipation device 20a of an LED illuminating device according to a second embodiment is illustrated. The heat dissipation device 20a includes a U-shaped housing 22a at a bottom side thereof and a heat sink 23a mounted on the housing 22a. The housing 22a includes a rectangular bottom plate 221a and two parallel first side plates 222a formed on two opposite sides of the bottom plate 221a. The two first side plates 222a extend vertically and upwardly from front and rear sides of the bottom plate 221a towards the heat sink 23a. Two engaging grooves 227 are defined in an evaporating surface 223a of the bottom plate 221a and located at the other two opposite sides (i.e., left and right sides) of the bottom plate 221a. Two opposite ends of each engaging groove 227 extend upwardly in inner surfaces of the two first side plates 222a to top ends of the two first side plates 222a. The housing 22a can be integrally formed as a single piece by extrusion or pressing.

The heat sink 23a includes a rectangular metal base 231a, a plurality of spaced metal fins 232a and two parallel second side plates 239 integrally formed on the base 231a. The base 231a has an inner surface 233a facing the housing 22a and an opposite outer surface 234a. The fins 232a extend vertically and upwardly from the outer surface 234a of the base 231a. The two second side plates 239 extend vertically and downwardly from the inner surface 233a of the base 231a towards the housing 22a, and located at two opposite side (i.e., left and right sides) of the base 231a corresponding to the two engaging grooves 227 of the housing 22a, respectively. The heat sink 23a further includes a plurality of elongated supporting plates 238 formed between the two second side plates 239. The supporting plates 238 extend vertically and downwardly from the inner surface 233a of the base 231a towards the housing 22a, and are parallel to the two second side plates 239. A gap 2381 is defined through each supporting plate 238. The heat sink 23a can be integrally formed as a single piece by extrusion.

In assembly, the two second side plates 239 of the heat sink 23a are inserted in the engaging grooves 227 of the housing 22a to mount the heat sink 23a and the housing 22a together. Top ends of the two first side plates 222a abut the inner surface 233a of the base 231a of the heat sink 23a. Thus, the heat sink 23a and the housing 22a cooperatively define a hermetical chamber 24a of the heat dissipation device 20a. The two first side plates 222a and the two second side plates 239 cooperatively form a closed sidewall for the hermetical chamber 24a. Similar to the heat dissipation device 20 shown in FIG. 3, a wick structure (not shown) is attached to inner surfaces of the first and second side plates 222a, 239, the inner surface 233a of the base 231a of the heat sink 23a and the evaporating surface 223a of the bottom plate 221a which cooperatively define the hermetical chamber 24a before the housing 22a and the heat sink 23a are assembled together. In other words, the wick structure is received in the hermetical chamber 24a and attached to the heat dissipation device 20a at a periphery of the hermetical chamber 24a. A working fluid is filled in the hermetical chamber 24a. Bottom ends of the supporting plates 238 contact with the evaporating surface 223a of the bottom plate 221a of the housing 22a. The supporting plates 238 have a larger supporting capability than the supporting posts 225 shown in FIG. 2. The hermetical chamber 24a is divided into a plurality of regions by the supporting plates 238. Every two adjacent regions of the hermetical chamber 24a are located at two sides of one supporting plate 238, and are communicated with each other via the gap 2381 of the supporting plate 238.

Figure 5:
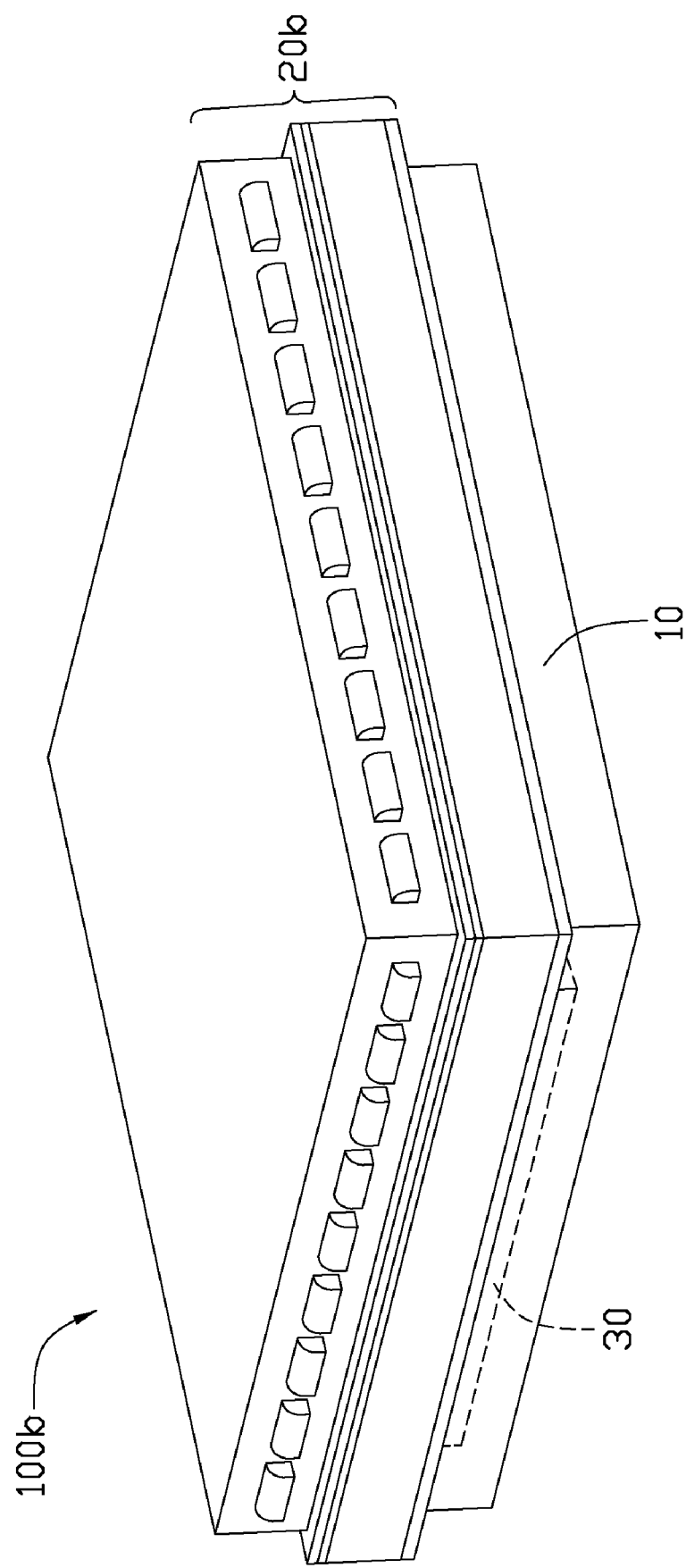
FIG. 5 is an assembled, isometric view of an LED illuminating device in accordance with a third embodiment.
Figure 6:
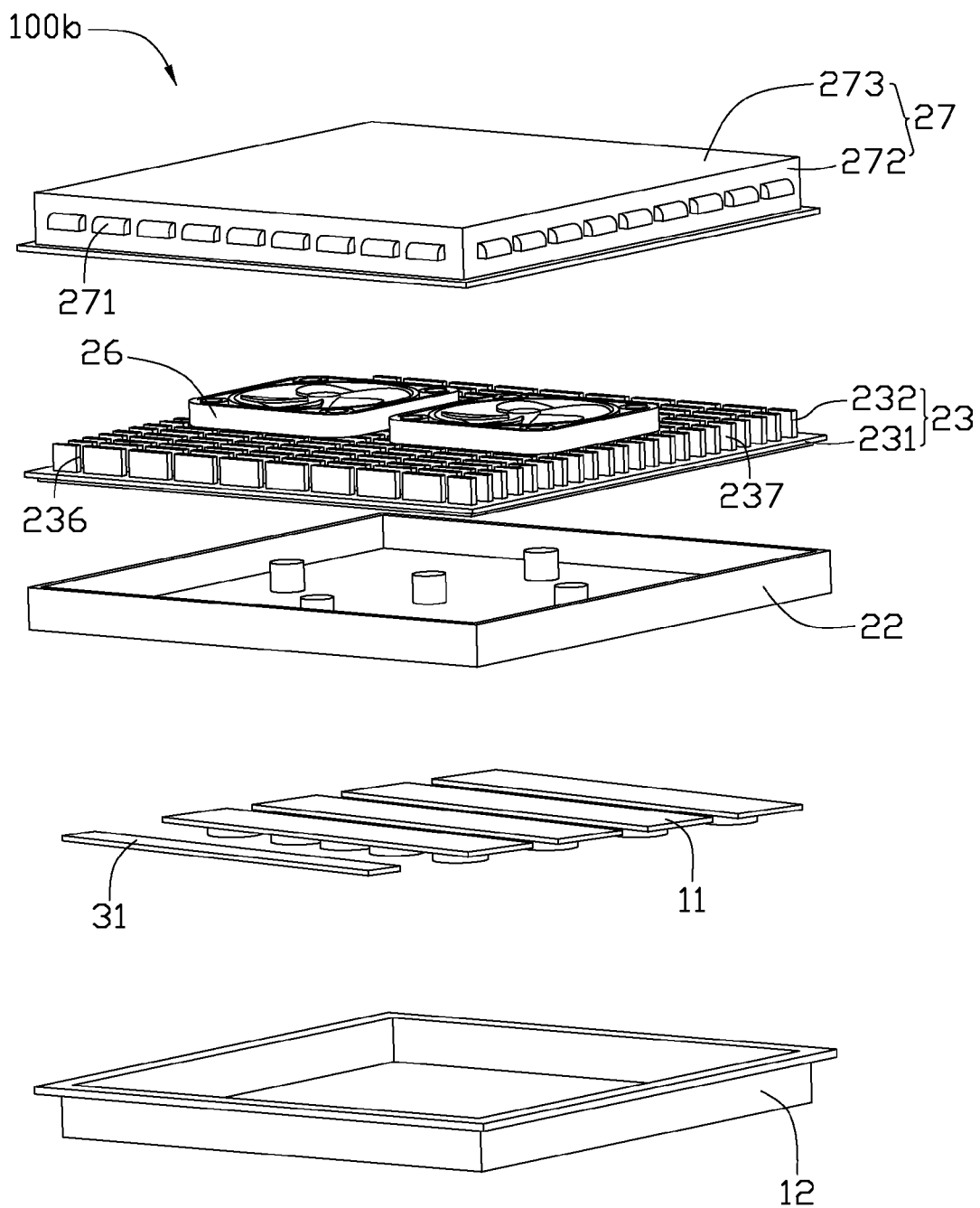
FIG. 6 is an exploded, isometric view of the LED illuminating device of FIG. 5, with a wick structure thereof removed.

Referring to FIGS. 5-6, an LED illuminating device 100b according to a third embodiment is illustrated. Except the following differences, the LED illuminating device 100b of the present embodiment is essentially the same as the LED illuminating device 100 of the previous embodiment. In the present embodiment, two cooling fans 26 and a top cover 27 are provided above the heat sink 23. The cooling fans 26 are arranged on top ends of the fins 232 of the heat sink 23. The top cover 27 includes a rectangular top plate 273 and a peripheral wall 272 extending downwardly from an outer periphery of the top plate 273 towards the heat sink 23. A plurality of air holes 271 are defined in the peripheral wall 272 of the top cover 27. The top cover 27 is mounted on the heat sink 23 and covers the fans 26 and the fins 232 of the heat sink 23 therein.

When the cooling fans 26 operate, the cooling fans 26 inhale air into the top cover 27 via some of the air holes 271, which are located corresponding to the communicating grooves 236 of the fins 232. The airflow generated by the cooling fans 26 flows towards the heat sink 23. The airflow flows along the air passages 237 of the heat sink 23, and is then exhausted out of the top cover 27 through the other ones of the air holes 271, which are located corresponding to the air passages 237.

Figure 7:
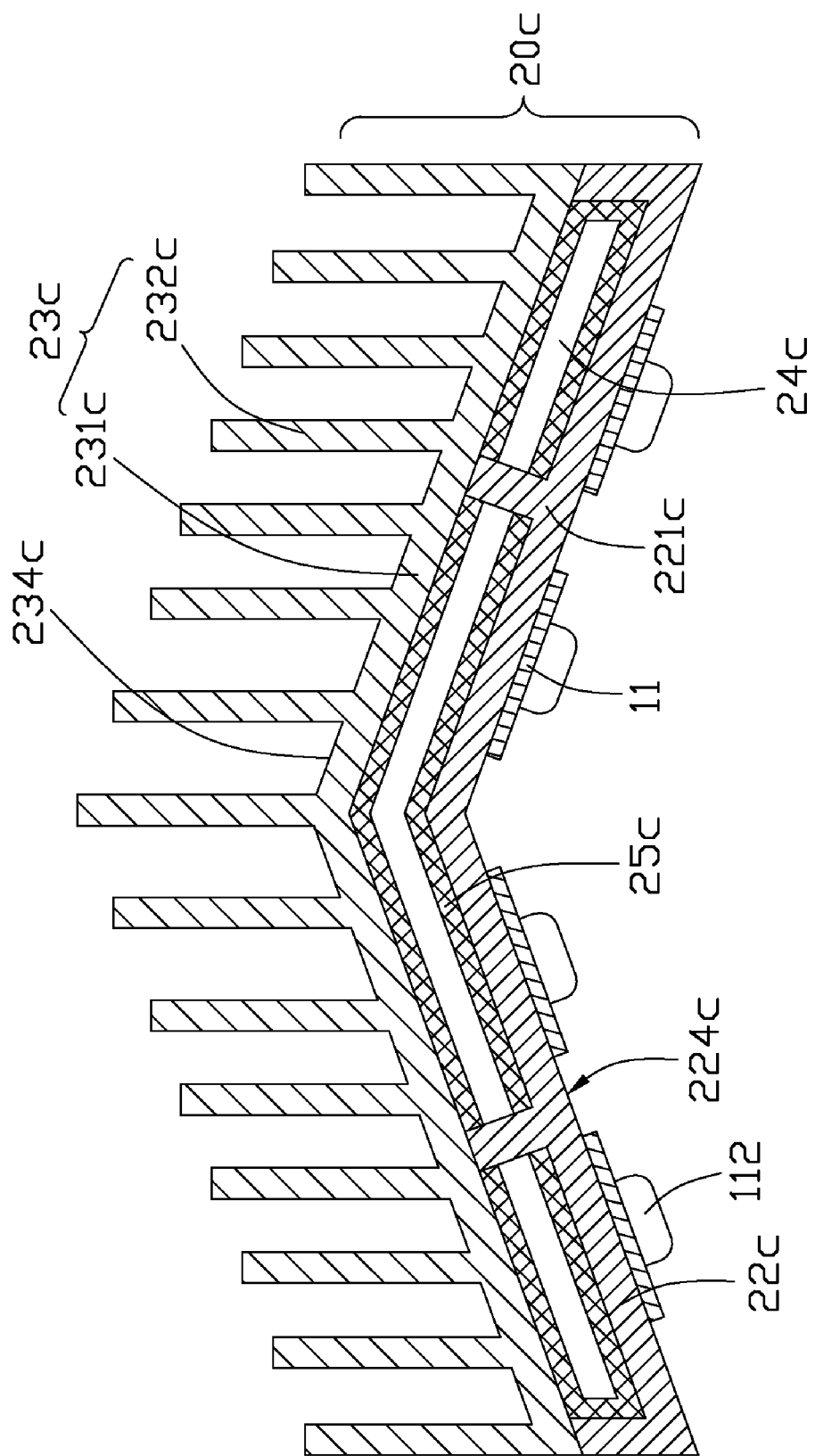
FIG. 7 is a cross-sectional view of a light engine of an LED illuminating device according to a fourth embodiment.

Referring to FIG. 7, a light engine of an LED illuminating device according to a fourth embodiment is illustrated. The light engine is formed by attaching an LED light source 11 shown in FIG. 2 to a heat dissipation device 20c. The heat dissipation device 20c includes a housing 22c at a bottom side thereof and a heat sink 23c mounted on the housing 22c. Except the following differences, the light engine of the present embodiment is essentially the same as the light engine shown in FIG. 3. In the present embodiment, the housing 22c includes a substantially inverted V-shaped bottom plate 221c, and the heat sink 23c includes a substantially inverted V-shaped base 231c. A hermetical chamber 24c is cooperatively defined by the housing 22c and the base 231c of the heat sink 23c. The hermetical chamber 24c has a substantially inverted V-shaped cross-section. A wick structure 25c is attached to inner surfaces of the housing 22c and the base 231c of the heat sink 23c, which cooperatively define the hermetical chamber 24c. In other words, the wick structure 25c is received in the hermetical chamber 24c and attached to the heat dissipation device 20c at a periphery of the hermetical chamber 24c. A working fluid is filled in the chamber 24c. The base 231c has a convex outer surface 234c at a top side thereof. A plurality of fins 232c extend upwardly from the convex outer surface 234c of the base 231c. The bottom plate 221c of the housing 22c has a concave heat absorbing surface 224c at a bottom side thereof. The LEDs 1112 of the LED light source 11 are arranged on the concave heat absorbing surface 224c of the bottom plate 221c. The light engine of the present embodiment is constructed as a converging type light engine wherein light emitted from the LEDs 1112 converges inwardly towards objects, so that the light engine can illuminate a desired small area with a focused and intensified light.

Figure 8:
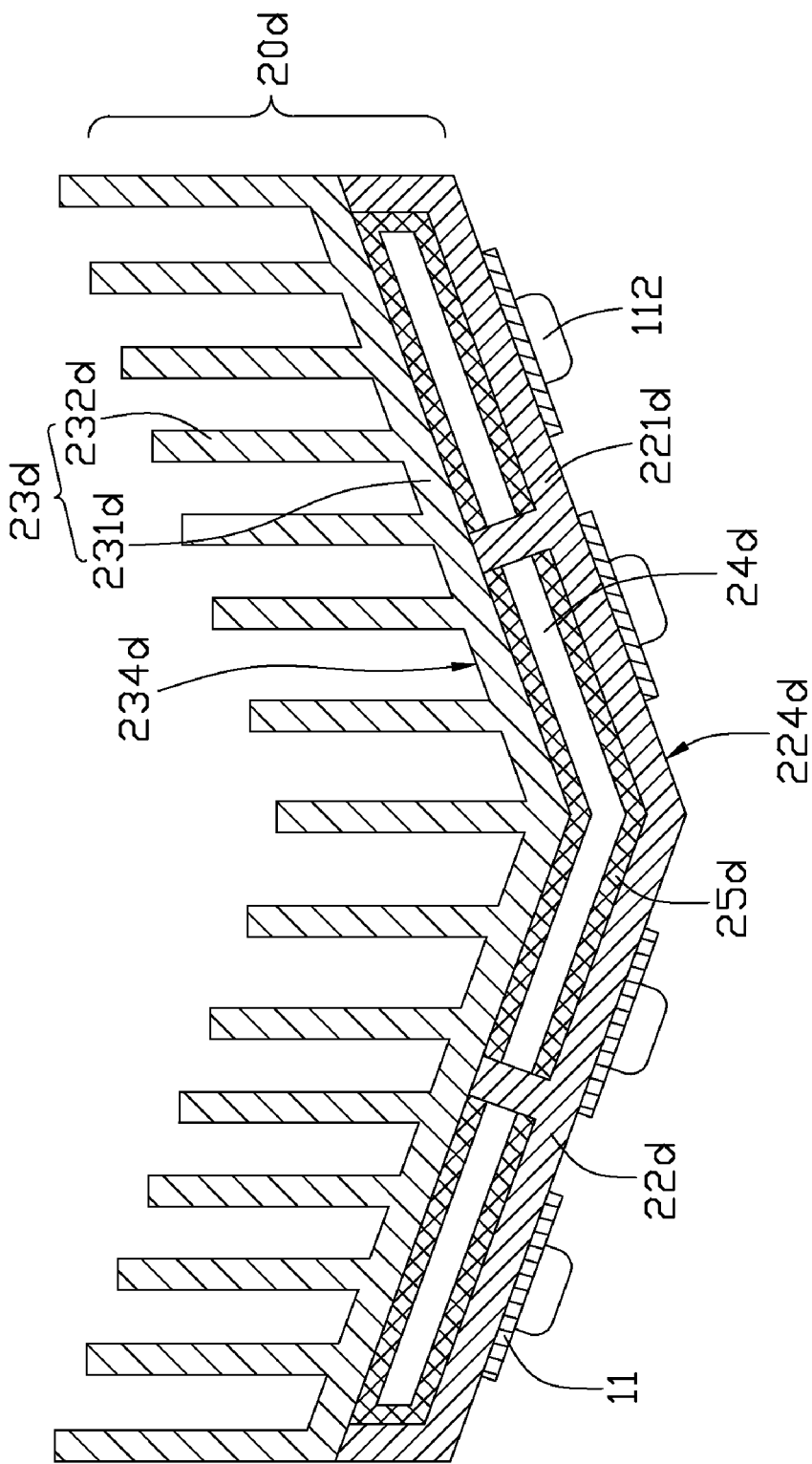
FIG. 8 is a cross-sectional view of a light engine of an LED illuminating device according to a fifth embodiment.

Referring to FIG. 8, a light engine of an LED illuminating device according to a fifth embodiment is illustrated. The light engine is formed by attaching a LED light source 11 shown in FIG. 2 to a heat dissipation device 20d. The heat dissipation device 20d includes a housing 22d at a bottom side thereof and a heat sink 23d mounted on the housing 22d. Except the following differences, the light engine of the present embodiment is essentially the same as the light engine shown in FIG. 3. In the present embodiment, the housing 22d includes a substantially V-shaped bottom plate 221d, and the heat sink 23d includes a substantially V-shaped base 231d. A hermetical chamber 24d is cooperatively defined by the housing 22d and the base 231d of heat sink 23d. The chamber 24d has a substantially V-shaped cross-section. A wick structure 25d is attached to inner surfaces of the housing 22d and the base 231d of the heat sink 23d, which cooperatively define the hermetical chamber 24d. In other words, the wick structure 25d is received in the hermetical chamber 24d and attached to the heat dissipation device 20d at a periphery of the hermetical chamber 24d. A working fluid is filled in the hermetical chamber 24d. The base 231d has a concave outer surface 234d at a top side thereof. A plurality of fins 232d extends upwardly from the concave outer surface 234d of the base 231d. The bottom plate 221d has a convex heat absorbing surface 224d at a bottom side thereof. The LEDs 1112 of the LED light source 11 are arranged on the convex heat absorbing surface 224c of the bottom plate 221d. The light engine of the present embodiment is constructed as a diverging type light engine wherein light emitted from the LEDs 1112 diverges outwardly towards objects, so that the light engine can illuminate a desired large area with a dispersed and soft light.

It is to be understood, however, that even though numerous characteristics and advantages of the present invention have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An LED (light emitting diode) illuminating device, comprising:
    an optical module comprising an LED light source, the LED light source being provided with a plurality of LEDs; and
    a heat dissipation device arranged on the optical module, the heat dissipation device comprising a housing and a heat sink located above and hermetically mounted on the housing, the heat sink comprising a base and a plurality of spaced fins formed on the base, the base having an inner surface facing the housing and an opposite outer surface, the fins extending outwardly from the outer surface of the base, the housing comprising a bottom plate, the bottom plate having an evaporating surface facing the base of the heat sink and an opposite heat absorbing surface, the LEDs of the LED light source being thermally attached to the heat absorbing surface of the bottom plate, the heat sink and the housing cooperatively defining a hermetical chamber therebetween, a closed sidewall of the chamber being sandwiched between the base of the heat sink and the bottom plate of the housing, a wick structure being received in the hermetical chamber and attached to the heat dissipation device at a periphery of the hermetical chamber, a working fluid being filled in the hermetical chamber and saturated in the wick structure.

2. The LED illuminating device of claim 1, wherein the wick structure comprises a first porous wick, a second porous wick spaced from the first porous wick, and a third porous wick arranged between the first porous wick and the second porous wick, the first porous wick being attached to the evaporating surface of the bottom plate of the housing, the second porous wick being attached to the inner surface of the base of the heat sink, the third porous wick being attached to an inner surface of the closed sidewall, two ends of the third porous wick respectively connecting with the first porous wick and the second porous wick, a vapor passage channel being defined between the first porous wick and the second porous wick.

3. The LED illuminating device of claim 1, wherein the closed sidewall integrally extends upwardly from an outer periphery of the bottom plate of the housing towards the heat sink, the base of the heat sink being hermetically mounted to a top of the closed sidewall.

4. The LED illuminating device of claim 1, wherein the bottom plate is rectangular, the housing being U-shaped and further comprising two first side plates respectively extending upwardly from two opposite sides of the bottom plate, the heat sink further comprising two second side plates extending downwardly from two opposite sides of the base, the heat sink being mounted to the housing with the two second side plates intermeshed with the two first side plates, the two first side plates and the two second side plates cooperatively forming the closed sidewall.

5. The LED illuminating device of claim 4, wherein the heat sink further comprises at least one elongated supporting plate extending downwardly from the inner surface of the base, a bottom end of the at least one supporting plate contacting with the evaporating surface of the bottom plate of the housing.

6. The LED illuminating device of claim 5, wherein at least one gap is defined through the at least one supporting plate.

7. The LED illuminating device of claim 1, wherein the hermetical chamber has a substantially inverted V-shaped cross-section, the outer surface of the base is convex, the heat absorbing surface of the bottom plate is concave, and light emitted from the LEDs converges inwardly.

8. The LED illuminating device of claim 1, wherein the hermetical chamber has a substantially V-shaped cross-section, the outer surface of the base is concave, the heat absorbing surface of the bottom plate is convex, and light emitted from the LEDs diverges outwardly.

9. The LED illuminating device of claim 1, wherein the heat dissipation device further comprises at least one cooling fan provided above the heat sink, the at least one cooling fan being mounted on a top of the heat sink, a top cover being mounted to the heat sink and covering the at least one cooling fan and the fins of the heat sink therein, a plurality of air holes being defined in a peripheral wall of the top cover.

10. The LED illuminating device of claim 1, further comprising an electrical module which includes a circuit board, the circuit board being attached on the heat absorbing surface of the bottom plate of the housing and electrically connected with the LED light source.

11. The LED illuminating device of claim 1, wherein the LED light source comprises a plurality of light bars mounted on the heat absorbing surface and evenly spaced from each other, each of the light bars comprising an elongated substrate, the LEDs being arranged on the substrates of the light bars.

12. The LED illuminating device of claim 1, wherein a plurality of supporting members are arranged in the hermetical chamber, and two ends of each the supporting member contact with the evaporating surface of the bottom plate and the inner surface of the base, respectively.

13. The LED illuminating device of claim 1, wherein an air passage is defined between every two adjacent fins, and a plurality of communicating grooves is defined in each of the fins to communicate with two adjacent air passages.

* * * * *